(12) United States Patent
Embong et al.

(10) Patent No.: US 6,436,736 B1
(45) Date of Patent: Aug. 20, 2002

(54) METHOD FOR MANUFACTURING A SEMICONDUCTOR PACKAGE ON A LEADFRAME

(75) Inventors: Saat Shukri Embong, Kuala Terengganu; Hou Boon Tan, Seremban; Kuan Ming Kan, Negera Sembilan, all of (MY)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/710,623

(22) Filed: Nov. 13, 2000

(51) Int. Cl.⁷ .................................................. H01L 21/82
(52) U.S. Cl. ...................... 438/125; 438/126; 438/127; 257/676
(58) Field of Search ............................. 438/125, 126, 438/127; 257/676, 669, 697, 709, 730

(56) References Cited

U.S. PATENT DOCUMENTS

| | | | |
|---|---|---|---|
| 3,444,441 A | * | 5/1969 | Helda et al. |
| 4,012,765 A | * | 3/1977 | Lehner et al. |
| 4,084,312 A | * | 4/1978 | Kirk et al. |
| 5,118,271 A | * | 6/1992 | Baird et al. |
| 5,223,740 A | * | 6/1993 | Ishikawa et al. |
| 5,327,008 A | * | 7/1994 | Djennas et al. |
| 5,683,944 A | * | 11/1997 | Joiner et al. |
| 5,882,955 A | | 3/1999 | Huang et al. ................ 438/111 |
| 5,889,317 A | | 3/1999 | Huang et al. ................ 257/666 |
| 6,121,674 A | * | 9/2000 | Corisis |

* cited by examiner

Primary Examiner—George Fourson
Assistant Examiner—Thanh V Pham

(57) ABSTRACT

A method of forming a semiconductor package (30) on a leadframe (20) trimmed from strip (10). Encapsulant (34) forms plastic tie bars (40) linking the semiconductor package (30) and the strip (10), to mechanically support, but electrically isolate, the semiconductor die (31) for functionality testing.

6 Claims, 2 Drawing Sheets

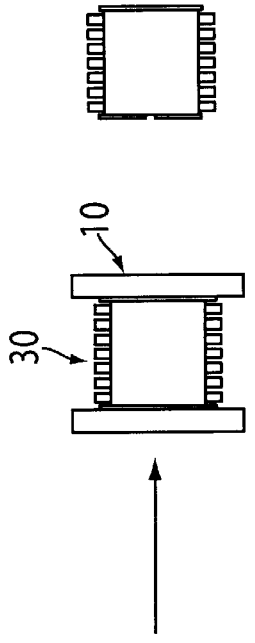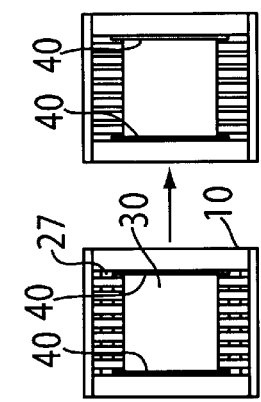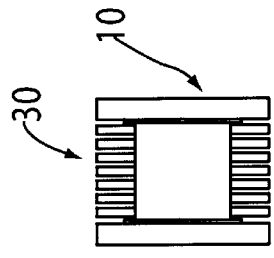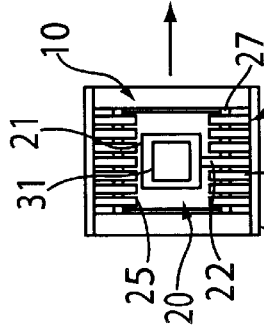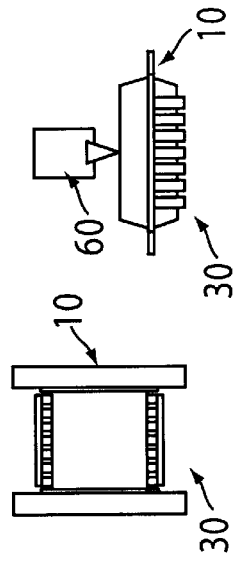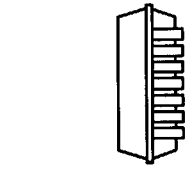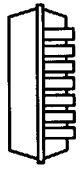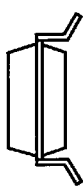

METHOD FOR MANUFACTURING A SEMICONDUCTOR PACKAGE ON A LEADFRAME

FIELD OF THE INVENTION

This invention relates to a method of manufacturing a semiconductor package on a leadframe. The invention is particularly suitable for, but not limited to, semiconductor packages that are mounted on leadframes which are trimmed from a strip after semiconductor dies have been encapsulated.

BACKGROUND OF THE INVENTION

Leadframes are employed during the manufacture of semiconductor packages. The advantage of lead frames is that leads of a semiconductor package can be kept in a desired position relative to each other and an associated flag (die mount) during wire bonding to a die and encapsulation of the die. Examples of known leadframes are disclosed in U.S. Pat. Nos. 5,882,955 and 5,889,317 both by Huang, Chih-Kung et al, and both assigned to Sitron Precision Co., Ltd.

A conventional leadframe has a flag portion coupled to peripheral portions by tie bar portions, and lead portions that extend inwardly from the peripheral portion towards the flag portion. Dam bar portions extend between adjacent lead portions, as well as between, lead portions and the peripheral portions.

A typical semiconductor packaging process comprises the steps of mounting a semiconductor die on the flag portion, connecting wires between the semiconductor die and free ends of the lead portions, and encapsulating the semiconductor die, the flag portion, the free ends of the lead portions and the wires in mold compound, to form a semiconductor package on the leadframe. Next, during a trim and form operation, the dam bar portions are cut away, and the lead portions are severed from the peripheral portions and bent to a predetermined shape. Finally, the tie bar portions are severed, thus separating the semiconductor package from the leadframe. The semiconductor packages are then individually tested. Handling individual semiconductor packages during testing is difficult, in part due to their small size, and in part due to the need for each of the semiconductor packages to be arranged in a particular orientation for testing. Another problem is defects, such as bent leads, caused by handling.

To reduce these handling problems, an approach that has been considered is to test the semiconductor packages while they are attached to the leadframe by the tie bar portions, i.e. before severing the tie bar portions. However, since all the flag portions on a leadframe are electrically coupled by the tie bar portions to the leadframe, effectively, this structure shorts all the flag portions together. In order to test the semiconductor packages on the leadframe, the semiconductor packages need to be electrically isolated.

Conventionally, removing the dam bar portions, severing and forming the lead portions, and severing the tie bar portions is performed by an integrated process utilizing in-line automated equipment. A disadvantage of testing first, then severing the tie bar portions is the interruption of the inline process. Another disadvantage is that, after testing, a leadframe must now be loaded onto a machine to sever the tie bar portions. These disadvantages reduce the efficiency of the semiconductor packaging process.

BRIEF DESCRIPTION OF THE DRAWINGS

The invention will now be described, by way of example, with reference to the drawings, in which:

FIGS. 1(a) to (g) inclusive are top plan views of the steps of the method of manufacturing the semiconductor package;

FIGS. 2(a), (b) and (c) are respective top plan, side elevation and end elevation views of the semiconductor package.

DETAIL DESCRIPTION OF THE DRAWINGS

Figure 3:
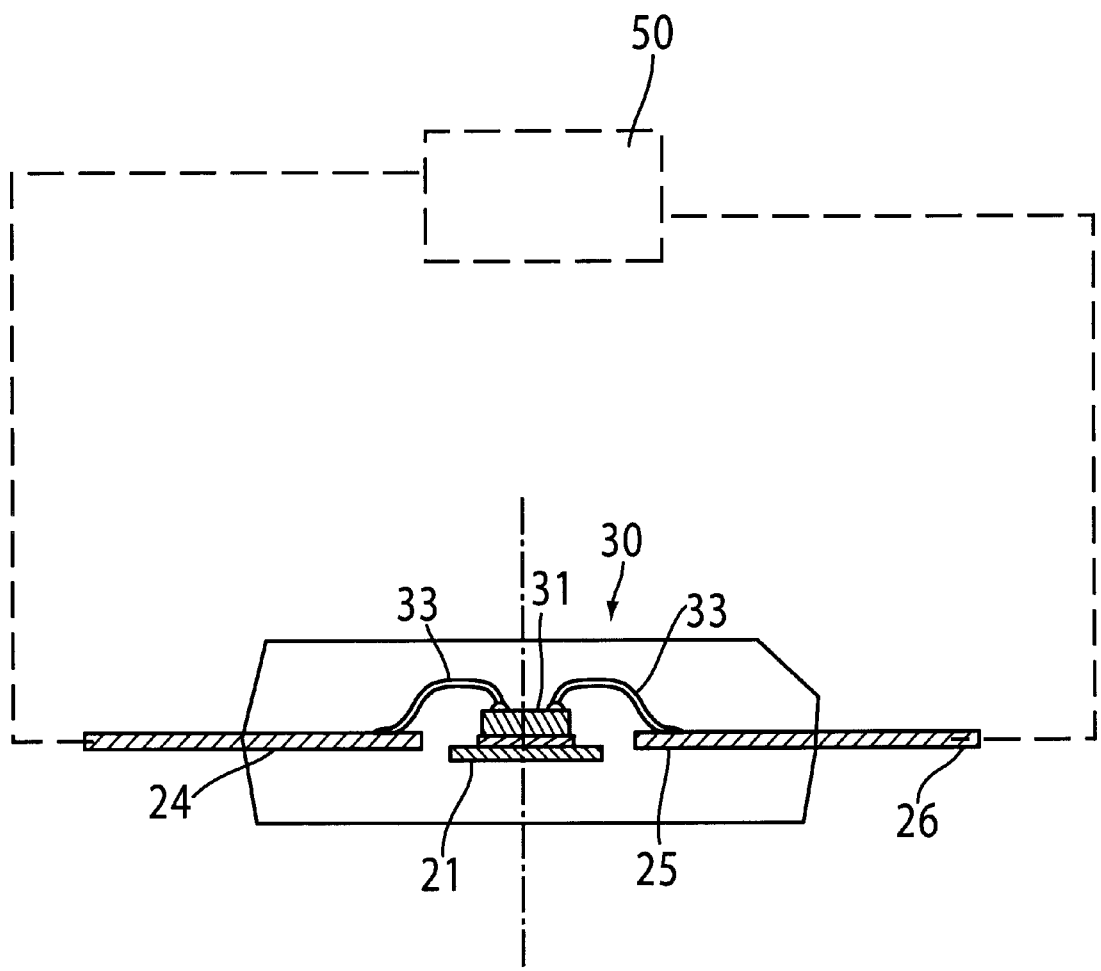
FIG. 3 is a sectional side view of the semiconductor package connected to a testing unit.

Referring to FIG. 1(a), there is illustrated a strip 10 having a leadframe 20 for packaging a semiconductor device in accordance with the present invention. Leadframe 20 has a flag portion 21 to support semiconductor die 31. A support portion 22 connects flag portion 21 to peripheral portion 23. Leadframe 20 has a plurality of lead portions 24. Each portion 24 has an inner lead portion 25, having a free end extending inwardly towards (but spaced a small distance from) flag portion 21, and an outer lead portion 26 extending from peripheral portion 23. The lead portions 24 and support portion 22 are connected together by connecting portions 27 which extend to strip 10.

During a semiconductor packaging process, semiconductor die 31 is mounted on flag portion 21, and wires 33 bonded between the free ends of inner lead portions 25 and semiconductor die 31. Semiconductor die 31, flag portion 21, the wires, and the inner lead portions 25, are then encapsulated in encapsulant or mold compound to form a semiconductor package. The molds (not shown) advantageously have cavities that form molded links between semiconductor package 30 (in FIG. 1(b)) that will be formed and strip 10.

Referring to FIG. 1(b), connecting portions 27 and strip 10 act as dambars for encapsulant during the molding process. The molding process forms links 40 which couple and support semiconductor package 30 on strip 10. As links 40 are of mold compound which is non-electrically conductive, semiconductor package 30 is supported on strip 10 but is electrically isolated from strip 10.

Referring to FIG. 1(c), connecting portions 27 are removed and links 40 continue to support semiconductor package 30 in the strip 10.

Referring to FIG. 1(d), outer lead portions 26 are severed from peripheral portion 23 and semiconductor die 31 can be connected to a test unit 50 (see FIG. 3) for functionality tests. Alternatively, as shown in FIG. 1(e), lead portions 24 are progressively formed.

As shown in FIG. 1(f), semiconductor package 30 is now ready to be singulated from strip 10, and this is effected by a push pin 60 or other mechanical driver which causes semiconductor package 30 to be released from strip 10 by breaking links 40. Semiconductor package 30 (see FIGS. 2(a) to (c) inclusive) is now formed.

The method of the present invention, as described, advantageously enables links 40 to be formed integrally with semiconductor package 30 as semiconductor die 31 and other components are encapsulated; enables semiconductor package 30 to be linked to, and supported by, strip 10 for electrical testing of semiconductor die 31 for functionality, semiconductor package 30 being electrically isolated from strip 10; and enables the completed semiconductor package 30 to be easily released from strip 10 in a controlled manner.

This enables high productivity rates to be maintained, while minimizing damage to semiconductor package 30 during the manufacturing and testing steps.

What is claimed is:

1. A method for forming a semiconductor package on a leadframe, the method comprising the sequential steps of
   (a) providing a semiconductor die, a leadframe, a plurality of wire bondings and an encapsulant;
   (b) mounting the semiconductor die on a flag portion of the leadframe, wherein at least one support portion extends from the flag portion to a peripheral portion of the leadframe;
   (c) connecting the plurality of wire bondings between terminals of the semiconductor die and at least some of a plurality of inner lead portions that extend inwardly from the peripheral portion of the leadframe proximal to the flag portion of the lead frame;
   (d) forming links that extend between the semiconductor package and a strip portion of the leadframe with the encapsulant to electrically isolate the semiconductor package from the leadframe;
   (e) severing outer lead portions and the support portion from the peripheral portion, wherein the outer lead portions are ends of the inner lead portions that are proximal to the peripheral portion; and
   (f) encapsulating the semiconductor die, the flag portion of the leadframe, the at least some of the plurality of inner lead portions of the leadframe, and the plurality of the wire bondings with the encapsulant, to form the semiconductor package.

2. A method in accordance with claim 1 further comprising, the step of:
   (g) severing the links to singulate the semiconductor package from the leadframe.

3. A method in accordance with claim 2 further comprising, after step (f), and before step (g), the step of:
   (h) electrically testing functionality of the semiconductor die in the semiconductor package.

4. A method in accordance with claim 3 further comprising, after step (f) and before step (g), the step of:
   (i) bending the outer lead portions to a predetermined shape.

5. A method in accordance with claim 4 further comprising performing step (h) prior to performing step (i).

6. A method in accordance with claim 4 further comprising forming step (h) after performing step (i).

* * * * *